US008286489B2

(12) United States Patent
Yamasaki

(10) Patent No.: US 8,286,489 B2
(45) Date of Patent: Oct. 16, 2012

(54) INPUT APPARATUS AND INPUT METHOD

(75) Inventor: Shuji Yamasaki, Tokyo (JP)

(73) Assignee: NEC Corporation, Tokyo (JP)

( * ) Notice: Subject to any disclaimer, the term of this patent is extended or adjusted under 35 U.S.C. 154(b) by 944 days.

(21) Appl. No.: 12/281,199

(22) PCT Filed: Mar. 26, 2007

(86) PCT No.: PCT/JP2007/056177
§ 371 (c)(1),
(2), (4) Date: Aug. 29, 2008

(87) PCT Pub. No.: WO2007/111291
PCT Pub. Date: Oct. 4, 2007

(65) Prior Publication Data
US 2009/0013788 A1      Jan. 15, 2009

(30) Foreign Application Priority Data
Mar. 29, 2006   (JP) ................................ 2006-091791

(51) Int. Cl.
*G01B 17/00* (2006.01)
(52) U.S. Cl. ........................................................ 73/617
(58) Field of Classification Search .................... 73/617, 73/627, 644
See application file for complete search history.

(56) References Cited

U.S. PATENT DOCUMENTS 5,149,918 A * 9/1992 Kozik et al. ................. 178/18.05
6,137,282 A   10/2000 Macke, Sr. et al.
2005/0088417 A1 * 4/2005 Mulligan ....................... 345/173
2006/0001653 A1 * 1/2006 Smits ............................. 345/176
2006/0002655 A1 * 1/2006 Smits ............................. 385/31
2007/0285406 A1 * 12/2007 Kukulj et al. ................. 345/176

FOREIGN PATENT DOCUMENTS

| EP | 0483519 A | 5/1992 |
| JP | 1993004254 A | 1/1993 |
| JP | 1995282699 A | 10/1995 |
| JP | 11194883 A * | 7/1999 |
| JP | 1999194883 A | 7/1999 |

OTHER PUBLICATIONS

International Preliminary Report on Patentability for PCT/JP2007/056177 issued Sep. 30, 2008.

* cited by examiner

*Primary Examiner* — Peter Macchiarolo
*Assistant Examiner* — Rose M Miller

(57) ABSTRACT

Disclosed is an input apparatus including a coplanar line formed on the surface of a substrate so as to pass through the vicinity of a position at which a user performs an operation, terminating resistor placed at one end of the coplanar line and a microcomputer module at the other end. The microcomputer module has a signal transmitter for outputting a signal to the coplanar line. When the user operates a key, the impedance of the coplanar line changes and a reflected wave is produced. A signal detector in the microcomputer module detects the reflected wave and outputs received-signal strength information, which indicates the strength of the signal included in the reflected wave, to a computing unit. Based upon the received-signal strength information and strength of the signal that has been output by the signal transmitter, the computing unit in the microcomputer module discriminates the key that has been operated and specifies the entered instruction.

11 Claims, 7 Drawing Sheets

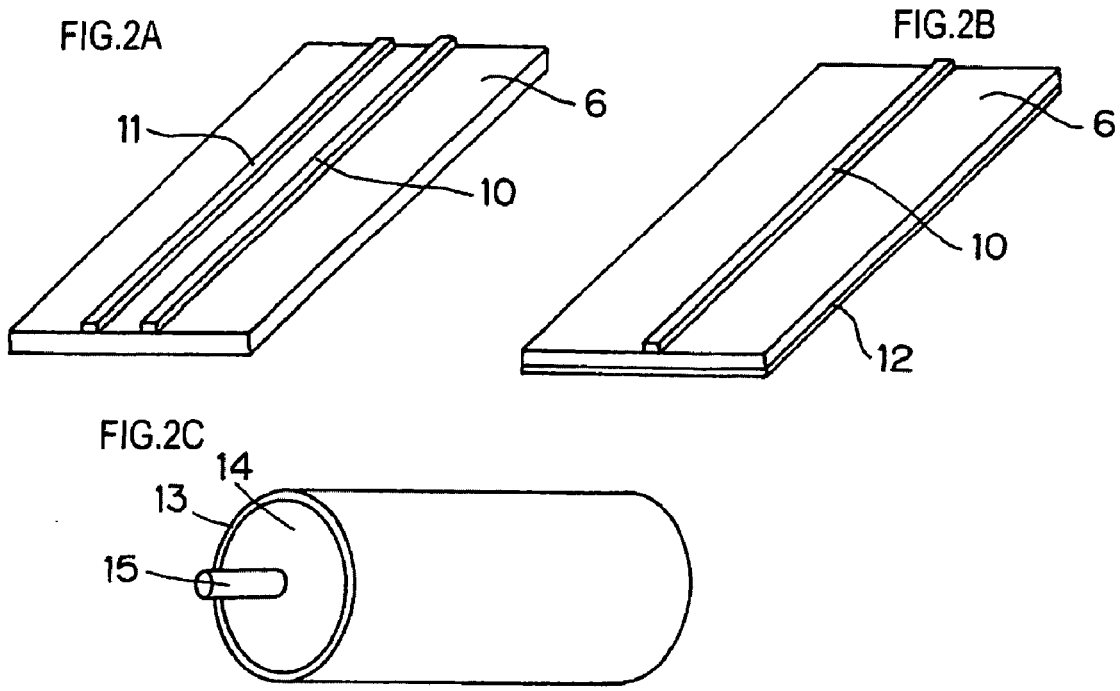
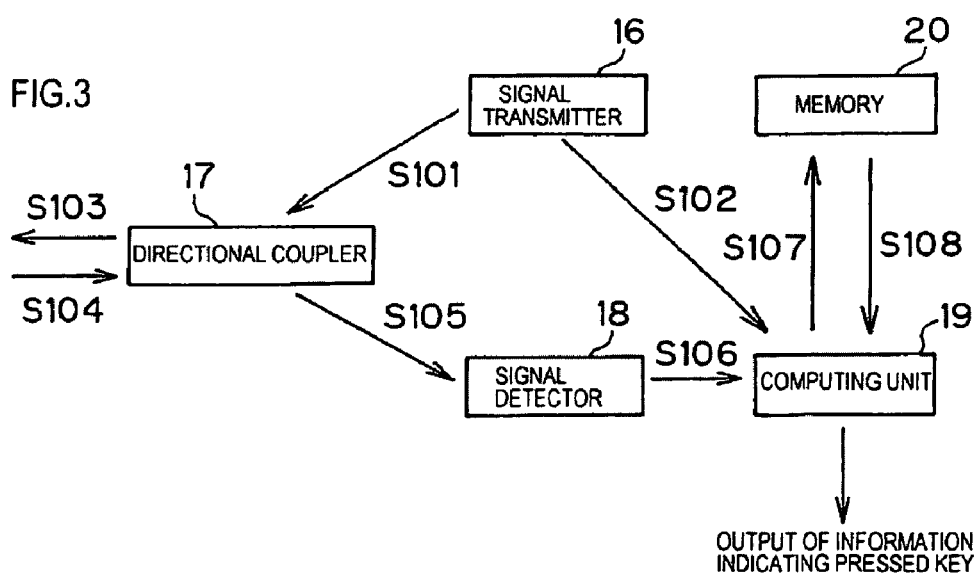

FIG.6
| TIME (t) | t | 2t | 3t | 4t | 5t | 6t | 7t | ----- | 15t |
|---|---|---|---|---|---|---|---|---|---|
| DISTANCE (l) | l | 2l | 3l | 4l | 5l | 6l | 7l | ----- | 15l |
| KEY INFORMATION | ← | 1 | 4 | 7 | * | 0 | 8 | ----- | # |
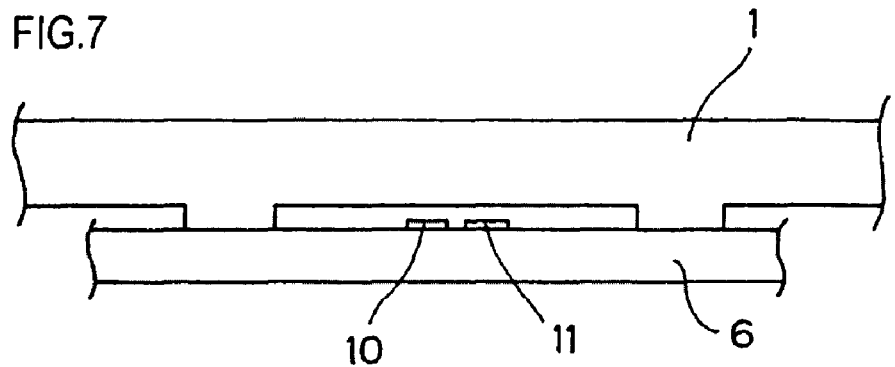
FIG.7
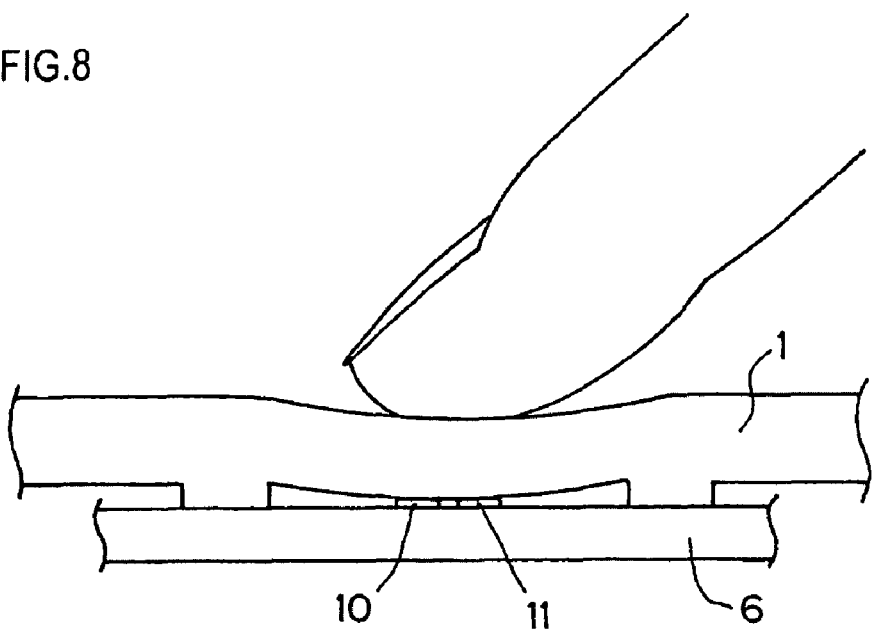
FIG.8

INPUT APPARATUS AND INPUT METHOD

TECHNICAL FIELD

This invention relates to a thin-type input apparatus and to an input method.

BACKGROUND ART

FIG. 11 is an explanatory view illustrating the configuration of a key portion at a conventional operating portion used in a portable terminal. A top view of the conventional key portion is illustrated in FIG. 11A, and a sectional view of the conventional key portion is illustrated in FIG. 11B.

The key portion illustrated in FIG. 11 includes a flexible key sheet placed in electrical insulation relative to a substrate 6 and having a recess with respect to the substrate 6, and a metal plate 9 secured in the recess as by an adhesive sheet or the like.

Further, as illustrated in FIG. 11B, the edge of the metal plate 9 is in contact with a pad face 7 formed on the substrate 6, and the central portion of the metal plate 9 is disposed so as to be displaceable in directions toward and away from the substrate 6. When the central portion of the metal plate 9 is pressed toward the substrate 6, the central portion of the metal plate 9 contacts a pad face 8 formed on the substrate 6. FIG. 12 is an explanatory view illustrating the central portion of the metal plate 9 in the pressed state.

When the metal plate 9 conducts electricity owing to contact with the pad face 8, a controller of the portable terminal detects the fact that the key portion has been pressed.

Patent Document 1 describes a switch in which a piezoelectric element is provided on one surface of a substrate. Ultrasonic waves within the substrate that change if a finger touches the other surface of the substrate are detected, whereby contact with the finger is detected.

[Patent Document 1] Japanese Patent Application Laid-Open No. 7-282699 (paragraphs 0018 to 0043; FIG. 1).

SUMMARY

Reductions in the thickness of portable terminals have been accompanied by the pursuit for a reduction in thickness of the key portions inclusive of a plurality of keys. However, with the structure of the conventional key portion illustrated in FIGS. 11 and 12, a gap must be provided between the central portion of the metal plate 9 and the pad face 8 so that the metal plate 9 and pad face will not conduct electrically in a state in which the key is not being pressed. As a consequence, it is difficult to reduce the thickness of the operating portion. The result is that a reduction in the thickness of the portable terminal is impeded.

Furthermore, in order to prevent faulty contact between the central portion of the metal plate 9 and the pad face 8, it is preferred to adopt an arrangement in which foreign matter and water will not penetrate into the gap between the central portion of the metal plate 9 and the pad face 8. In order to so arrange it that foreign matter or the like will not penetrate into the gap, the key assembly process is performed in a clean room or the key portion must be constructed in such a manner that foreign matter will not penetrate into the gap after shipping.

Further, when the metal plate 9 is reduced in thickness in order to reduce the thickness of the key portion, a problem which arises is that the strength of the metal plate 9 declines, leading to the danger of destruction.

Furthermore, since the piezoelectric element is provided on one surface of the substrate in the switch described in Patent Document 1, it is difficult to achieve a reduction in thickness.

Accordingly, an object of the present invention is to provide an input apparatus and method that enable a reduction in thickness and prevention of the occurrence of contact failure.

According to the present invention, there is provided an input apparatus including a substrate on a surface of which a signal line has been formed, and an insulating sheet disposed facing the surface of the substrate and having information, which represents a plurality of operating positions, indicated on a surface thereof that is opposite surface facing the substrate, characterized in that the apparatus comprises: signal transmitting means for outputting a signal to the signal line; reflected-wave detecting means for detecting a reflected wave of the signal that has been output by the signal transmitting means; and computing means for discriminating an operating position at which an operation has been performed, based upon the reflected wave detected by the reflected-wave detecting means.

In the present invention, the signal line may be formed so as to pass through the vicinity of the operating positions in the insulating sheet, and a ground line at ground potential may be formed on the substrate in parallel with the signal line.

In the present invention, the signal line may be formed so as to lengthen distance between a portion that passes through the vicinity of an operating position in the insulating sheet and a portion that passes through the vicinity of another operating position.

In the present invention, the computing means may discriminate an operating position at which an operation has been performed, based upon signal strength of the signal that has been output by the signal transmitting means and signal strength of the reflected wave detected by the reflected-wave detecting means.

In the present invention, the computing means may perform time domain reflectometry based upon signal strength of the signal that has been output by the signal transmitting means and signal strength of the reflected wave detected by the reflected-wave detecting means, and may discriminate an operating position at which an operation has been performed, based upon result of time domain reflectometry.

In the present invention, the input apparatus may further comprise storage means in which a table correlating the result of time domain reflectometry (TDR) and entered instructions has been stored in advance, wherein the computing means specifies an entered instruction based upon the table stored by the storage means and the result of TDR.

In the present invention, the signal line may be formed on the substrate so as to have a circular portion, and the computing means may discriminate an operation that has been performed on the insulating sheet, based upon a change in the result of TDR.

According to the present invention, three is provided an input method which uses an input apparatus having a substrate on a surface of which a signal line has been formed, and an insulating sheet disposed facing the surface of the substrate and having information, which represents a plurality of operating positions, indicated on a surface thereof that is on a side opposite a surface facing the substrate, characterized in that the method comprises: a signal output step of signal transmitting means outputting a signal to the signal line; a reflected-wave detecting step of reflected-wave detecting means detecting a reflected wave of the signal that has been output by the signal transmitting means at the signal output step; and a computing step of computing means discriminating an operating position at which an operation has been performed, based upon the reflected wave detected by the reflected-wave detecting means at the reflected-wave detecting step.

EFFECTS OF THE INVENTION

In accordance with the present invention, it is possible to prevent the occurrence of contact failure and to achieve a reduction in thickness. The reason for this is that in the present invention, the input apparatus does not have a mechanical switch structure and, as a result, the input apparatus can be reduced in thickness and it is possible to prevent the occurrence of contact failure due to entry of foreign matter, etc.

In a case where the signal line and the ground line have been formed on the substrate in parallel so as to pass through the vicinity of an operating position in the present invention, a coplanar line is constructed. If the finger of a user touches the operating position, therefore, a reflected wave of the signal that has been output by the signal transmitting means is produced and the reflected-wave detecting means can detect this reflected wave.

In a case where the signal line has been formed so as to lengthen distance between a portion that passes through the vicinity of an operating position in the insulating sheet and a portion that passes through the vicinity of another operating position in the present invention, the distance between the operating positions can be lengthened artificially to thereby enable lowering of the frequency of the signal that is output by the signal transmitting means.

In a case where the signal line is formed on the substrate so as to have a circular portion and it is so arranged that the computing means specifies an entered instruction based upon a change in the result of TDR in the present invention, the input apparatus is capable of accommodating input of an instruction that conforms to movement of the finger of a user.

BRIEF DESCRIPTION OF THE DRAWINGS

FIGS. 2A to 2C are a perspective views illustrating an examples of the structures of an electrical signal communication lines;

FIG. 3 is a block diagram illustrating an example of arrangement of microcomputer modules;

FIG. 6 is an explanatory view illustrating an example of a key map stored by a memory;

FIG. 7 is an explanatory view illustrating a cross section of a substrate and key sheet;

FIG. 8 is an explanatory view illustrating a cross section of a sheet key that is being pressed;

PREFERRED MODES OF THE INVENTION

Figure 1:
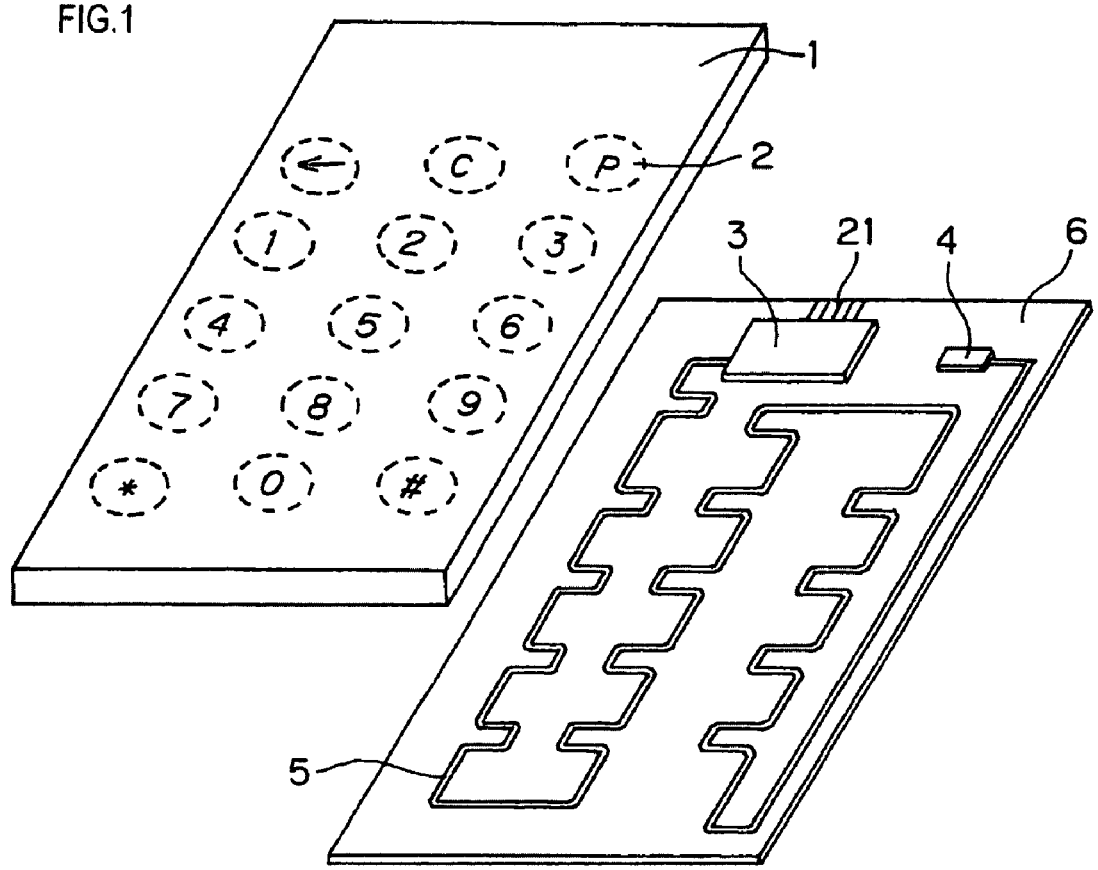
FIG. 1 is a perspective view illustrating an example of the configuration of a key input apparatus according to an embodiment of the present invention.

Exemplary embodiments of the present invention will be described with reference to the drawings. FIG. 1 is a perspective view illustrating an example of the configuration of a key input apparatus (input apparatus) according to an exemplary embodiment of the present invention.

The key input apparatus shown in FIG. 1 includes an elastic key sheet (insulating sheet) 1, the main ingredient of which is silicone rubber or the like, and a substrate 6 on which a coplanar line 5 has been formed.

In a case where the key sheet 1 is applied to numeric keys, numerals and the like are printed on one surface of the key sheet 1 and recesses of a conical or cylindrical shape are provided at portions on the other surface that correspond to the numerals, etc., printed on the first-mentioned surface. In other words, the positions of the recesses provided in one surface of the key sheet 1 correspond to positions 2 of keys of the numerals, etc., printed on the key sheet 1.

A terminating resistor 4 is placed at one end of the coplanar line 5 on substrate 6, and a microcomputer module 3 is placed at the other end of the coplanar line. The coplanar line 5 is formed so as to pass through the vicinity of each key of the numerals, etc., printed on the key sheet 1. Interface lines 21 are formed on the substrate 6 for connecting the microcomputer module 3 and other modules, etc.

FIG. 2 is a perspective view illustrating an example of the structure of an electrical signal communication line. A coplanar line shown in FIG. 2A includes a signal line 10 formed on one surface of the substrate 6, and a ground line 11 at ground potential disposed in parallel with the signal line 10 and formed so as to have the same cross-sectional area as that of the signal line 10.

A microstrip line shown in FIG. 2B is a structure in which the signal line 10 is formed on one surface of the substrate 6 and a ground layer 12 at ground potential is formed on the other surface.

A coaxial line shown in FIG. 2C is a structure in which an internal conductor (signal line) 15 is provided at the center of a cylindrical line, an external conductor 13 is provided at the periphery of the cylindrical line, and the space between the internal conductor 15 and external conductor 13 is filled with a dielectric 14.

FIG. 3 is a block diagram illustrating an example of the configuration of a portion of the microcomputer module 3 that relates to the sending and receiving of signals and to computation. The microcomputer module 3 shown in FIG. 3 includes a directional coupler 17, a signal generator (signal transmitting means) 16, a signal detector (reflected-wave detecting means) 18, a computing unit (computing means) 19 and a memory (storage means) 20. Using TDR (Time Domain Reflectometry), which is means for directly measuring reflected waves in time domain, the microcomputer module 3 detects a position at which there is an impedance mismatch in the coplanar line 5, thereby specifying an entered instruction.

The signal transmitter 16 outputs a signal while varying the frequency from 30 kHz to 3 GHz, by way of example. Further, the signal transmitter 16 outputs transmit-signal strength information, which indicates the strength of the output signal, to the computing unit 19. The directional coupler 17 outputs the signal, which has been output by the signal transmitter 16, to the coplanar line 5, and outputs the reflected wave, which has been output from the coplanar line 5, to the signal detector 18.

The signal detector 18 detects the reflected wave that has been output by the directional coupler 17 and outputs received-signal strength information, which is information indicating the signal strength of the signal included in the reflected wave, to the computing unit 19. On the basis of the transmit-signal strength information and received-signal strength information, the computing unit 19 computes frequency-domain reflection coefficient and subjects the computed frequency-domain reflection coefficient to an inverse Fourier transform to thereby compute time-domain reflection coefficient. It should be noted that frequency-domain reflection coefficient is the ratio of signal strength of the signal included in the reflected wave to signal strength of the signal of each frequency that is output by the signal transmitter 16. Further, time-domain reflection coefficient is the rate of change in the reflected wave of the signal output by the signal transmitter 16 with respect to time.

In order to measure a position at which there is an impedance mismatch in the coplanar line 5 based upon time-domain reflection coefficient, the memory 20 stores the TDR waveform in a case where there is no impedance mismatch. Further, the memory 20 stores a key map that correlates time from the moment the signal transmitter 16 outputs a signal to the moment an impedance mismatch occurs (namely time it takes for the impedance of the coplanar line 5 to change); distance, which corresponds to this time, from the directional coupler 17 of the microcomputer module 3 to the position at which the impedance mismatch occurred; and the key corresponding to this distance.

Figure 4:
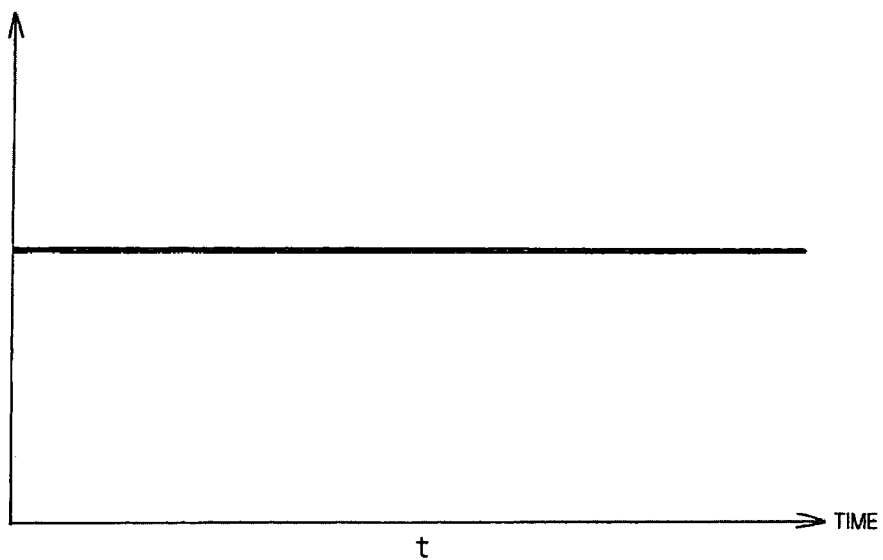
FIG. 4 is an explanatory view illustrating a TDR waveform in a case where an impedance mismatch has not occurred in a coplanar line.

FIG. 4 is an explanatory view illustrating a TDR waveform in a case where an impedance mismatch has not occurred in the coplanar line 5. If an impedance mismatch has not occurred in the coplanar line 5, a reflected wave of the signal that has been output by the signal transmitter 16 is not produced. If time is plotted along the horizontal axis and impedance along the vertical axis, therefore, as illustrated in FIG. 4, then a flat TDR waveform is obtained.

Figure 5:
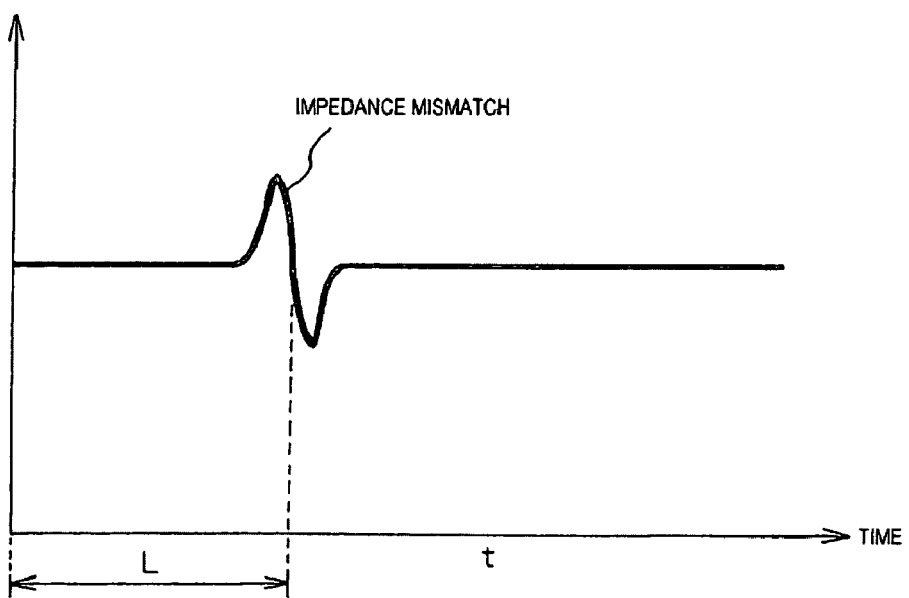
FIG. 5 is an explanatory view illustrating a change in impedance.

FIG. 5 is an explanatory view illustrating a change in impedance of the coplanar line 5. In the example shown in FIG. 5, it is shown that impedance changes L seconds after the signal transmitter 16 outputs a signal. FIG. 6 is an explanatory view illustrating an example of a key map stored by the memory 20. In the example shown in FIG. 6, it is illustrated that in a case where impedance changes 2t seconds after the signal transmitter 16 outputs a signal, an impedance mismatch occurs at a position whose distance from the microcomputer module 3 is 2l and a "1" key corresponds to this position.

The characteristic impedance of the coplanar line 5 is decided by the width and thickness of the signal line 10 and ground line 11. The signal line 10 and ground line 11 that construct the coplanar line 5 are each formed by a single line in order to make the characteristic impedance uniform. Further, the coplanar line 5 is formed on the substrate 6 in bent fashion taking into consideration the resolution of TDR.

The path formed by the coplanar line 5 on the substrate 6 will now be described. The distance between keys on an ordinary portable terminal is on the order of 10 mm. In order to mount the key input apparatus on a portable terminal, therefore, the resolution of TDR must be made less than 10 mm. Further, it is assumed that the resolution of TDR is one-fourth of the wavelength of the signal having the highest frequency among signals that are output by the signal transmitter 16. Accordingly, the signal transmitter 16 must output a signal having a frequency of 7.5 GHz.

However, since a high-frequency signal exhibits strong rectilinear propagation property, the signal may radiate from the coplanar line 5. In order to lower the frequency of the signal that is output by the signal transmitter 16, the path of the coplanar line 5 on the substrate 6 is formed in bent fashion to lengthen the distance between keys artificially. In other words, the coplanar line 5 is formed to have bent portions in order to lengthen the distance between the portions that pass through the vicinity of each of the keys in the key sheet 1.

FIG. 7 is an explanatory view illustrating the cross section of the substrate 6 and key sheet 1. The signal line 10 and ground line 11 are formed on the surface of the substrate 6 that faces the key sheet 1. The widths and heights of the conductor portions of the signal line 10 and ground line 11 are uniform. It should be noted that the widths and heights of the conductor portions of the signal line 10 and ground line 11 and the cross-sectional shape of the key sheet 1 in the vicinity of the signal line 10 are set in such a manner that the characteristic impedance of the coplanar line 5 (see FIG. 1) will be the same at any portion whatsoever. In other words, if the key sheet 1 is not pressed, an impedance mismatch is not produced in the coplanar line 5 comprising the signal line 10 and ground line 11. That is, in relation to the coplanar line comprising the signal line 10 and ground line 11 wired on the surface of the substrate 6 so as to pass through the recesses provided in the side of the key sheet 1 that faces the substrate 6, a gap exists between the key sheet 1 and the opposing surface of the substrate in a state in which the key sheet 1 is not being pressed, as illustrated in FIG. 7.

In the example illustrated in FIG. 7, an impedance mismatch is not produced in the coplanar line 5 because the key sheet 1 is not being pressed. Consequently, the signal that has been output by the signal transmitter 16 is consumed by the terminating resistor 4 and a reflected wave is not produced.

FIG. 8 is an explanatory view illustrating a cross section of the sheet key 1 that is being pressed. When the key sheet 1 is pressed, as shown in FIG. 8, the key sheet 1, which is a dielectric, is deformed (flexed) and comes into contact with the coplanar line 5 (see FIG. 1) comprising the signal line 10 and ground line 11 so that dielectric constant at the periphery of the signal line changes. An impedance mismatch is produced in the coplanar line as a result. A reflected wave of the signal that has been output by the microcomputer module 3 (see FIG. 1) is produced at the position on the coplanar line 5 where the impedance mismatch is produced. The reflected wave of the signal that has been output by the microcomputer module 3 advances toward the microcomputer module 3 through the coplanar line 5.

Next, the operation of the microcomputer module 3 of FIG. 1 will be described with reference to FIG. 3. The signal transmitter 16 varies frequency continuously from low frequency (e.g., 30 kHz) to high frequency (e.g., 3 GHz) and outputs a signal at all times (step S101). The signal transmitter 16 outputs transmit-signal strength information, which indicates the strength of the output signal, to the computing unit 19 (step S102).

The directional coupler 17 outputs the signal, which has been output by the signal transmitter 16, to the coplanar line 5 (step S103. If an impedance mismatch has been produced in the coplanar line 5 (see FIG. 1), a reflected wave is output from the coplanar line 5 to the directional coupler 17 (step S104). The directional coupler 17 outputs the output reflected wave to the signal detector 18 (step S105). The signal detector 18 detects the reflected wave that has been output by the directional coupler 17 and outputs received-signal strength information, which is information indicating the signal strength of the signal included in the reflected wave, to the computing unit 19 (step S106).

The computing unit 19 of FIG. 3 computes frequency-domain reflection coefficient based upon the transmit-signal strength information output by the signal transmitter 16 and received-signal strength information output by the signal detector 18. The computing unit 19 subjects the computed frequency-domain reflection coefficient to an inverse Fourier transform and obtains the result of TDR (the TDR waveform).

If an impedance mismatch is produced in the coplanar line 5, a reflected wave of the signal that has been output by the signal transmitter 16 is produced. If time is plotted along the horizontal axis and impedance along the vertical axis, therefore, as illustrated in FIG. 5, then a TDR waveform indicating a change in impedance is obtained.

The time it takes for the TDR waveform of FIG. 5 to indicate a change in impedance is proportional to the distance between the position at which impedance mismatch occurred and the directional coupler 17 of the microcomputer module 3. Therefore, by referring to the key map stored in the memory 20 exemplified in FIG. 6, the computing unit 19 is capable of discriminating which key has been pressed based upon the time it takes for the TDR waveform to indicate a change in impedance (steps S107, S108 shown in FIG. 3).

The computing unit 19 specifies the entered instruction based upon the result of discrimination. The computing unit 19 outputs information indicating the instruction (key) specified and entered (pressed) to control means of a portable terminal or the like on which the input apparatus has been mounted.

Figure 11A:
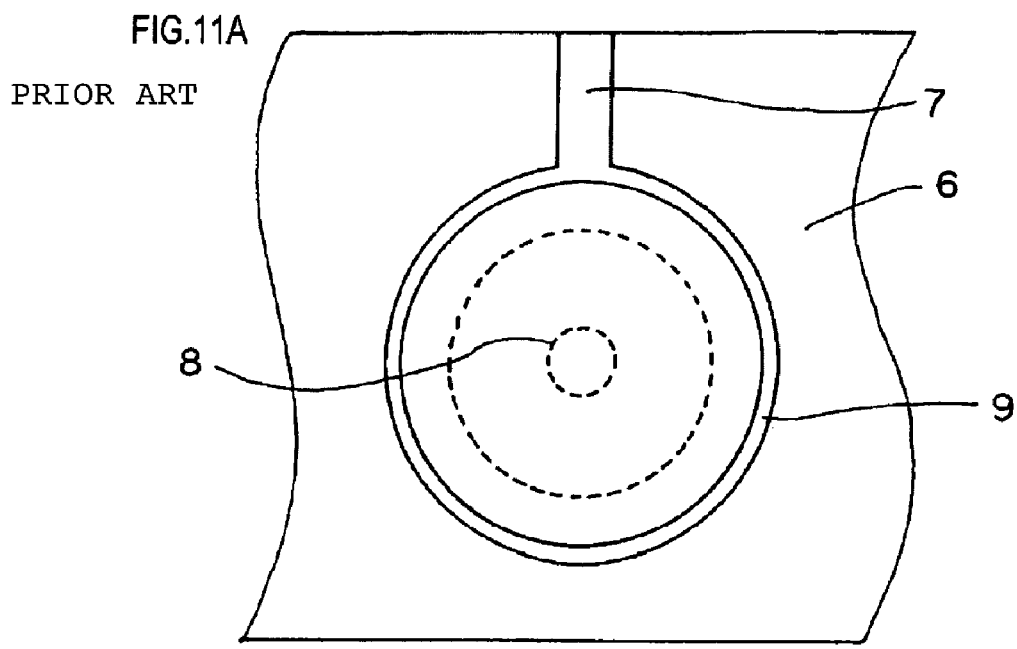
FIGS. 11A and 11B show respectively explanatory top plan and cross sectional views illustrating the configuration of a conventional key portion used in a portable terminal of the related art.
Figure 11B:
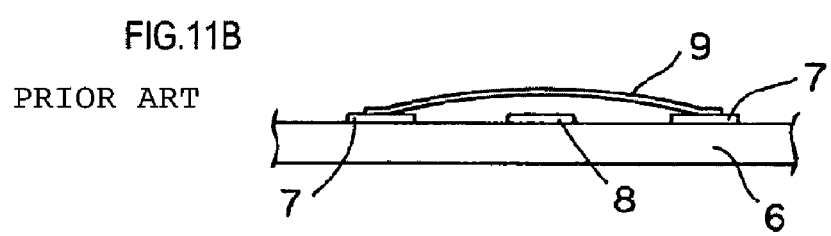
Figure 12:
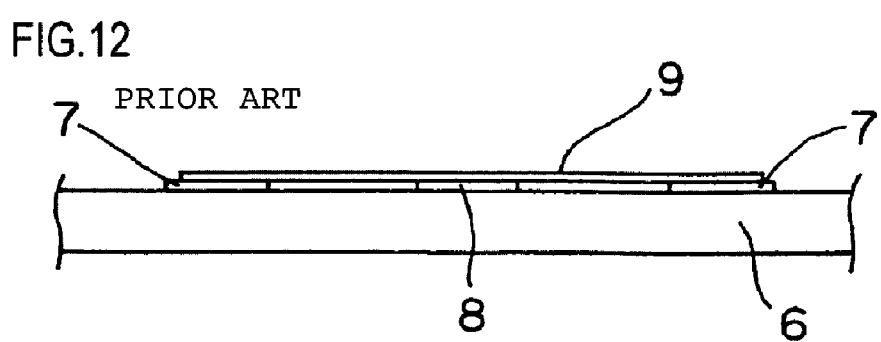
FIG. 12 is an explanatory view illustrating the central portion of a metal plate in a pressed state in the related art.

In accordance with this exemplary embodiment, the key input apparatus is constructed by the substrate 6, on which the coplanar line 5 has been formed, and the flexible key sheet 1. Accordingly, dome-shaped recesses of the kind shown in FIG. 11 are unnecessary. This makes it possible to reduce the thickness of the key input apparatus.

Further, in accordance with this exemplary embodiment, which key has been pressed is determined based upon a change in the impedance of the coplanar line 5 formed on the substrate 6. This makes it unnecessary to provide another device or the like below the keys and makes it possible to reduce the thickness of the key input apparatus.

Further, in accordance with this exemplary embodiment, mechanical switches do not exist between the coplanar line 5 formed on the substrate 6 and the key sheet 1. The effect obtained is that the key input apparatus does not experience deterioration and malfunction due to mechanical wear. Further, even if foreign matter and water, etc., penetrate into the space between the coplanar line 5 formed on the substrate 6 and the key sheet 1, malfunction such as contact failure will not occur.

Figure 9:
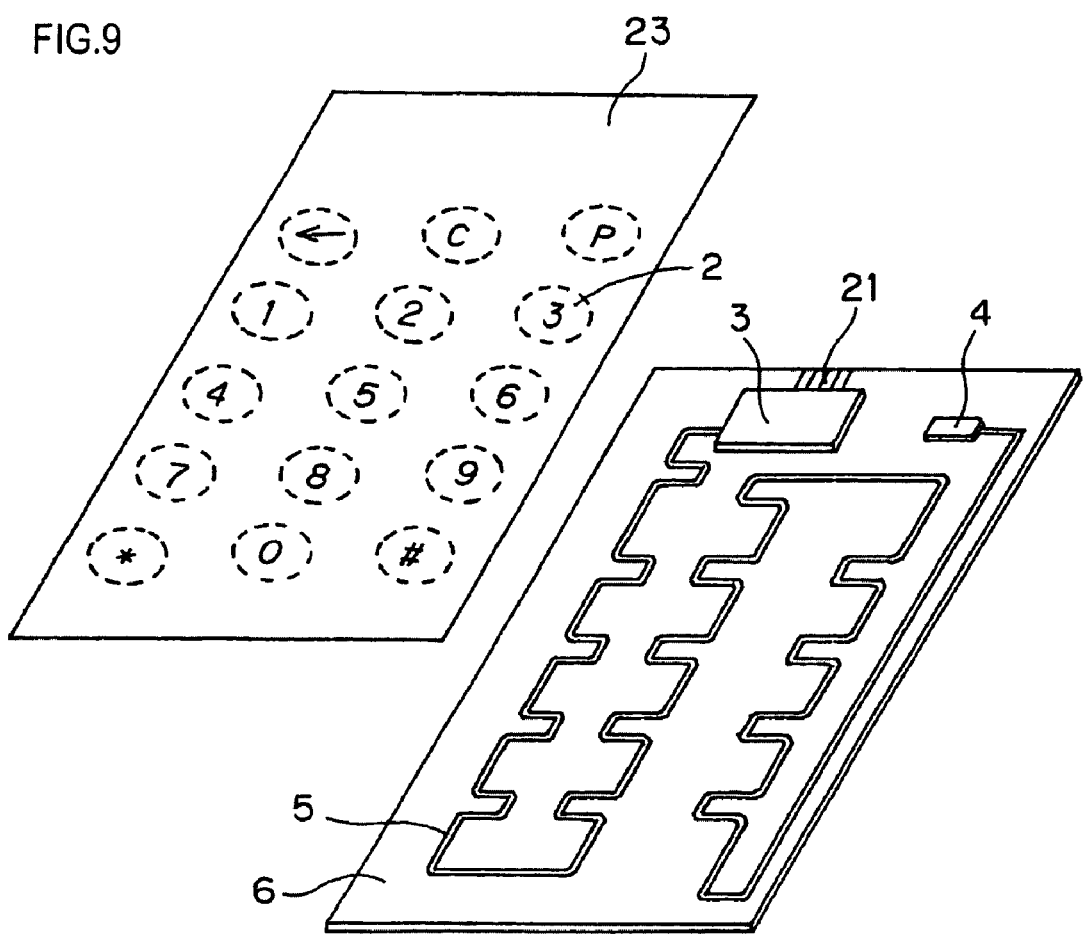
FIG. 9 is a perspective view illustrating a key input apparatus in which a film has been placed.

It should be noted that instead of the key sheet 1, an insulating film 23 on which key positions have been indicated may be placed on the surface of the substrate 6 on which the coplanar line 5 has been formed. FIG. 9 is a perspective view illustrating the key input apparatus in a case where, instead of the key sheet 1, film 23 on which key positions have been indicated has been placed on the surface of the substrate 6 on which the coplanar line 5 has been formed.

In this case also in which the film 23 has been placed on the surface of the substrate 6 on which the coplanar line 5 has been formed, when the film 23 is touched by a finger or the like, the dielectric constant at the periphery of the position touched by the finger or the like changes and an impedance mismatch is produced. Consequently, a reflected wave is produced at the position of the coplanar line 5 touched by the finger or the like and the microcomputer module 3 obtains the TDR waveform based upon the reflected wave and can discriminate which key was touched by the finger, etc.

In a case where the film 23 on which the key positions have been indicated is placed on the surface of the substrate 6 on which the coplanar line 5 has been formed, a greater reduction in the thickness of the key input apparatus can be achieved in comparison with the case where the key sheet 1 is used. It is desired that the film 23 have a high durability.

Figure 10:
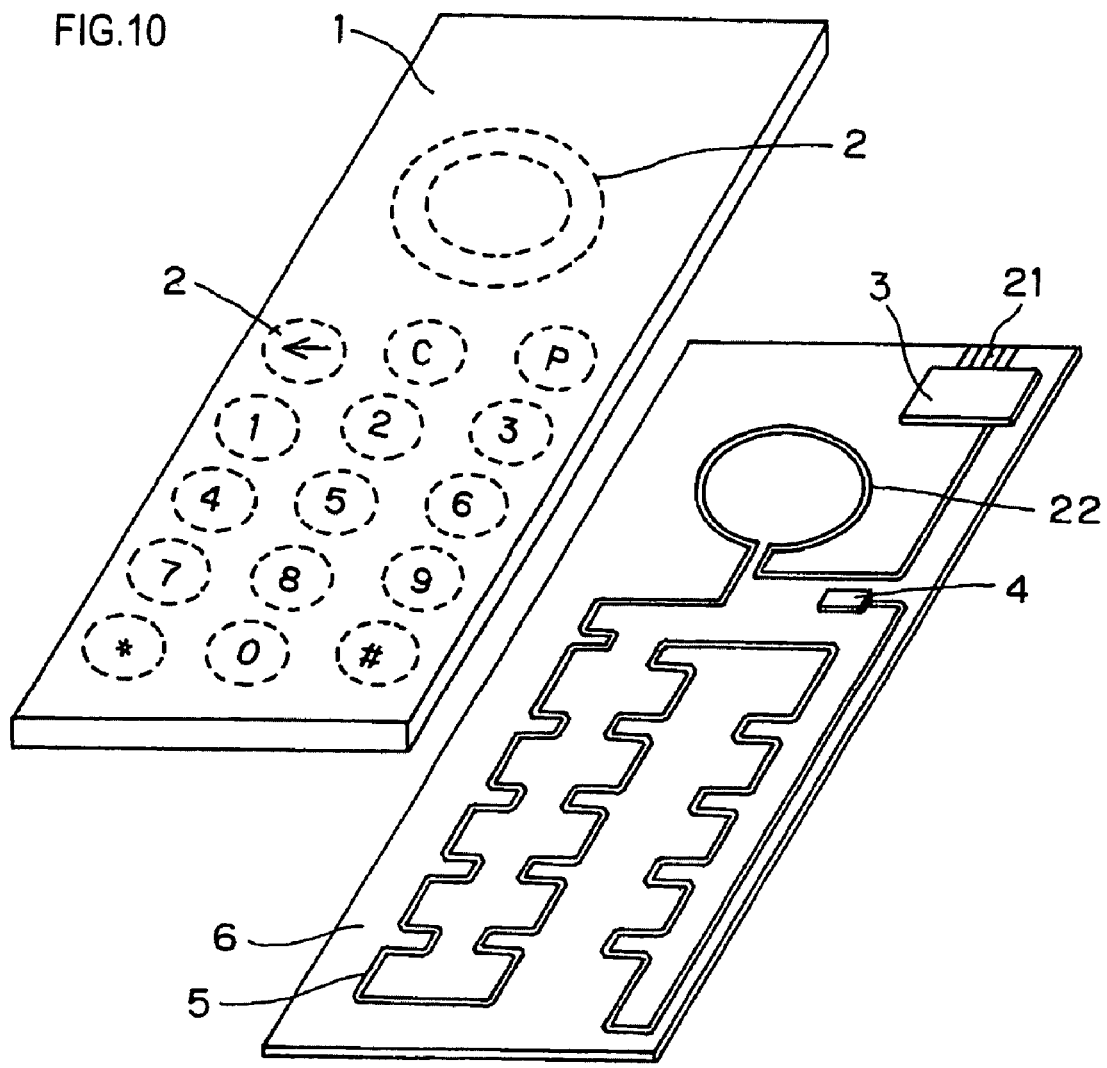
FIG. 10 is a perspective view illustrating a key input apparatus in which a portion of a coplanar line has been formed into a circle.

Further, the coplanar line 5 may have a portion 22 formed into a circle. FIG. 10 is a perspective view illustrating a key input apparatus in which a portion of the coplanar line 5 has been formed into a circle. If the portion of the key sheet 1 corresponding to the portion 22 of the coplanar line 5 formed into a circle is traced with a finger, then an impedance mismatch is produced at the portion traced. The position at which the impedance mismatch is produced changes depending upon the motion of the finger. Consequently, if the microcomputer module 3 discriminates motion of the finger based upon a change in the position at the impedance mismatch occurred, then the key input apparatus can be equipped with a disk-shaped operating portion.

It should be noted that discrimination by the computing unit (computing means) 19 of an operated operating position based upon a reflected wave detected by the signal detector (reflected-wave detecting means) 18 means that the computing unit 19 measures the time it takes for the signal detector 18 to detect a reflected wave and computes the distance between the signal detector 18 and the operated operating position based upon the measured time, thereby discriminating the operated operating position.

The discrimination by the computing unit 19 of an operated operating position based upon the signal strength of the signal output by the signal generator (signal transmitting means) 16 and the signal strength of the reflected wave detected by the signal detector (reflected-wave detecting means) 18 means that the computing unit 19 compares the signal strength of the signal output by the signal transmitter 16 and the signal strength of the reflected wave detected by the signal detector (reflected-wave detecting means) 18, determines that the signal detector 18 has detected a reflected wave at a timing at which the signal detector 18 has detected a signal having a signal strength different from a signal strength of the signal which has been output by the signal transmitter 16, and computes the distance between the signal detector 18 and the operating position where the operation has been done based upon the time it takes for the signal detector 18 to detect the reflected wave, thereby discriminating the operating position where the operation has been done.

Carrying out measurement of time domain reflection coefficient by the computing unit 19 based upon the signal strength of the signal that has been output by the signal transmitter 16 and the signal strength of the reflected wave detected by the signal detector 18 means that the computing unit 19 compares the signal strength of the signal that has been output by the signal transmitter 16 as frequency is changed and the signal strength of the signal of each frequency included in the reflected wave detected by the signal detector 18, computes the frequency-domain reflection coefficient, subjects the computed frequency-domain reflection coefficient to an inverse Fourier transform and carries out time domain reflection coefficient.

The discrimination by the computing unit 19 of an operated operating position based upon the TDR result, namely the result of measurement of the time domain reflection coefficient, means that the computing unit 19 computes the distance between the signal detector 18 and the operated operating position based upon the timing at which the time-domain reflection coefficient changes, thereby discriminating the operated operating position.

The identification by the computing unit 19 of an entered instruction based upon the table stored by the storage means and the TDR result means that the computing unit 19 refers to the table correlating timings at which time-domain reflection coefficient changed and entered instructions and determines that an instruction corresponding to a timing at which time-domain reflection coefficient changed is an entered instruction.

INDUSTRIAL APPLICABILITY

The present invention can be utilized in an input apparatus of a portable terminal or the like.

The invention claimed is:

1. An input apparatus comprising:
a substrate on a surface of which a signal line is formed;
an insulating sheet disposed facing the surface of the substrate and having information, which represents a plurality of operating positions, displayed on a surface thereof that is on a side opposite a surface facing the substrate;
a signal transmitter that outputs a signal with a single frequency to the signal line while varying the frequency over a predetermined frequency range;
a reflected-wave detector that detects, as received-signal strength information, a signal strength of a reflected wave of the signal output by the signal transmitter; and
a computing unit that computes a frequency-domain reflection coefficient based upon the received-signal strength information and transmit-signal strength information indicative of a strength of the signal output by the signal transmitter, subjects the computed frequency-domain reflection coefficient to an inverse Fourier transform to compute a time-domain reflection coefficient, and discriminates an operating position at which an operation has been performed, wherein
the signal line is formed so as to lengthen a distance between a portion that passes through the vicinity of the operating position in the insulating sheet and a portion that passes through the vicinity of another operation position.

2. The input apparatus according to claim 1, wherein the signal line is formed so as to pass through the vicinity of the operating positions in the insulating sheet, and a ground line at ground potential is formed on the substrate in parallel with the signal line.

3. The input apparatus according to claim 1, wherein the computing unit performs based upon result of time domain reflectometry (TDR) which is the result of the measurement of time domain reflection coefficient.

4. The input apparatus according to claim 3, further comprising a storage unit in which a table correlating the result of TDR and entered instructions is stored in advance;
wherein the computing unit specifies an entered instruction based upon the table stored by the storage unit and the result of TDR.

5. The input apparatus according to claim 3, wherein the signal line is formed on the substrate so as to have a circular portion; and
the computing unit discriminates an operation that has been performed on the insulating sheet, based upon a change in the result.

6. An input method using an input apparatus comprising a substrate on a surface of which a signal line has been formed, and an insulating sheet disposed facing the surface of the substrate and having information, which represents a plurality of operating positions, displayed on a surface thereof that is on a side opposite a surface facing the substrate, the method comprising:
transmitting a signal with a single frequency to the signal line while varying the frequency over a predetermined frequency range;
detecting, as received-signal strength information, a signal strength of a reflected wave of the signal which has been transmitted to the signal line;
computing a frequency-domain reflection coefficient based upon the received-signal strength information and transmit-signal information indicative of a strength of the signal which has been transmitted to the signal line;
subjecting the computed frequency-domain reflection coefficient to an inverse Fourier transform to compute a time-domain reflection coefficient; and
discriminating an operating position at which an operation has been performed, wherein
the signal line is formed so as to lengthen a distance between a portion that passes through the vicinity of the operating position in the insulating sheet and a portion that passes through the vicinity of another operation position.

7. An input apparatus comprising:
an insulating member having keys assigned to predetermined prescribed portions thereof;
a substrate having a signal line on a side thereof opposing the insulating member, the signal line being wired so as to pass through positions corresponding to the portions on the insulating member to which the keys are assigned and having one end thereof terminated; and
a computing unit that computes a frequency-domain reflection coefficient based upon received-signal strength information indicative of a signal strength of a reflected wave of a signal transmitted to the signal line with a single frequency that varies over a predetermined frequency range and transmit-signal information indicative of a strength of the signal transmitted to the signal line, subjects the computed frequency-domain reflection coefficient to an inverse Fourier transform to compute a time-domain reflection coefficient, and discriminates an operated key based upon result of measuring a reflected wave, which is produced in the signal line by an impedance mismatch, when a portion on the insulating member to which a key is assigned is operated in a state in which a signal is being supplied from the other end of the signal line, wherein
the signal line is formed so as to lengthen a distance between a portion that passes through the vicinity of an operating position in the insulating member and a portion that passes through the vicinity of another operation position.

8. The input apparatus according to claim 7, wherein the signal line includes a portion wired in the form of a loop, the portion corresponding to a disk-shaped key operating portion provided on the insulating member, and wherein
the computing unit discriminates motion of a finger of an operator based upon a reflected wave produced in the signal line in accordance with motion of the finger when the disk-shaped key operating portion of the insulating member is operated by the finger of the operator in a state in which a signal is being supplied from the other end of the signal line.

9. The input apparatus according to claim 7, wherein the insulating member has recesses in a surface thereof facing the substrate, the recesses corresponding to positions indicating information representing operating positions on the surface of the opposite side; and the signal line is wired so as to pass through positions corresponding to the recesses of the insulating member.

10. The input apparatus according to claim 7, wherein the insulating member comprises a film disposed on the substrate surface.

11. The input apparatus according to claim 7, wherein the signal line has bent portions on the substrate at portions that pass through the vicinity of the portion on the insulating member to which the keys are assigned.

* * * * *